(12) United States Patent
Paulson et al.

(10) Patent No.: US 9,103,930 B2
(45) Date of Patent: Aug. 11, 2015

(54) SENSOR ASSEMBLY

(75) Inventors: Hans Paulson, Horten (NO); Vidar A. Husom, Asker (NO); Nicolas Goujon, Oslo (NO)

(73) Assignee: WESTERNGECO L.L.C., Houston, TX (US)

( * ) Notice: Subject to any disclaimer, the term of this patent is extended or adjusted under 35 U.S.C. 154(b) by 461 days.

(21) Appl. No.: 13/479,099

(22) Filed: May 23, 2012

(65) Prior Publication Data

US 2013/0315036 A1 Nov. 28, 2013

(51) Int. Cl.
*G10K 11/00* (2006.01)
*G01V 1/18* (2006.01)
*H01L 23/02* (2006.01)
*G01V 1/38* (2006.01)

(52) U.S. Cl.
CPC .............. *G01V 1/184* (2013.01); *G10K 11/006* (2013.01); *B81B 2207/09* (2013.01); *G01V 1/38* (2013.01); *H01L 23/02* (2013.01)

(58) Field of Classification Search
CPC ... G10K 11/006; H01L 23/02; B81B 2207/09

USPC ............ 367/153, 141; 438/106; 257/E21.499
See application file for complete search history.

(56) References Cited

U.S. PATENT DOCUMENTS

| | | | |
|---|---|---|---|
| 6,289,732 B1 * | 9/2001 | Murari et al. ................... | 73/493 |
| 6,962,834 B2 * | 11/2005 | Stark .............................. | 438/107 |
| 2009/0056411 A1 | 3/2009 | Goujon et al. | |
| 2010/0116054 A1 | 5/2010 | Paulson | |
| 2011/0097845 A1 * | 4/2011 | Ables et al. .................... | 438/106 |
| 2012/0082002 A1 * | 4/2012 | Iseli ............................... | 367/76 |

FOREIGN PATENT DOCUMENTS

WO 2010054216 A2 5/2010

* cited by examiner

*Primary Examiner* — Mark Hellner

(57) ABSTRACT

A multiple axis sensor assembly includes an enclosure and encapsulated microelectromechanical system (MEMS) sensors. The encapsulated sensors are disposed inside the enclosure and are mounted in different orientations, which correspond to different axes of the sensor assembly. A controller of the sensor assembly is disposed in the enclosure and electrically coupled to the MEMS sensors.

7 Claims, 2 Drawing Sheets

SENSOR ASSEMBLY

BACKGROUND

Seismic exploration involves surveying subterranean geological formations for hydrocarbon deposits. A survey typically involves deploying seismic source(s) and seismic sensors at predetermined locations. The sources generate seismic waves, which propagate into the geological formations creating pressure changes and vibrations along their way. Changes in elastic properties of the geological formation scatter the seismic waves, changing their direction of propagation and other properties. Part of the energy emitted by the sources reaches the seismic sensors. Some seismic sensors are sensitive to pressure changes (hydrophones), others to particle motion (e.g., geophones), and industrial surveys may deploy only one type of sensors or both. In response to the detected seismic events, the sensors generate electrical signals to produce seismic data. Analysis of the seismic data can then indicate the presence or absence of probable locations of hydrocarbon deposits.

Some surveys are known as "marine" surveys because they are conducted in marine environments. However, "marine" surveys may be conducted not only in saltwater environments, but also in fresh and brackish waters. In one type of marine survey, called a "towed-array" survey, an array of seismic sensor-containing streamers and sources is towed behind a survey vessel.

SUMMARY

In an example implementation, a multiple axis sensor assembly includes an enclosure and encapsulated microelectromechanical system (MEMS) sensors. The MEMS sensors are disposed inside the enclosure and are mounted in different orientations, which correspond to different axes of the sensor assembly. A controller of the sensor assembly is disposed in the enclosure and is electrically coupled to the MEMS sensors.

Advantages and other desired features will become apparent from the following drawing, description and claims.

DETAILED DESCRIPTION

Figure 1:
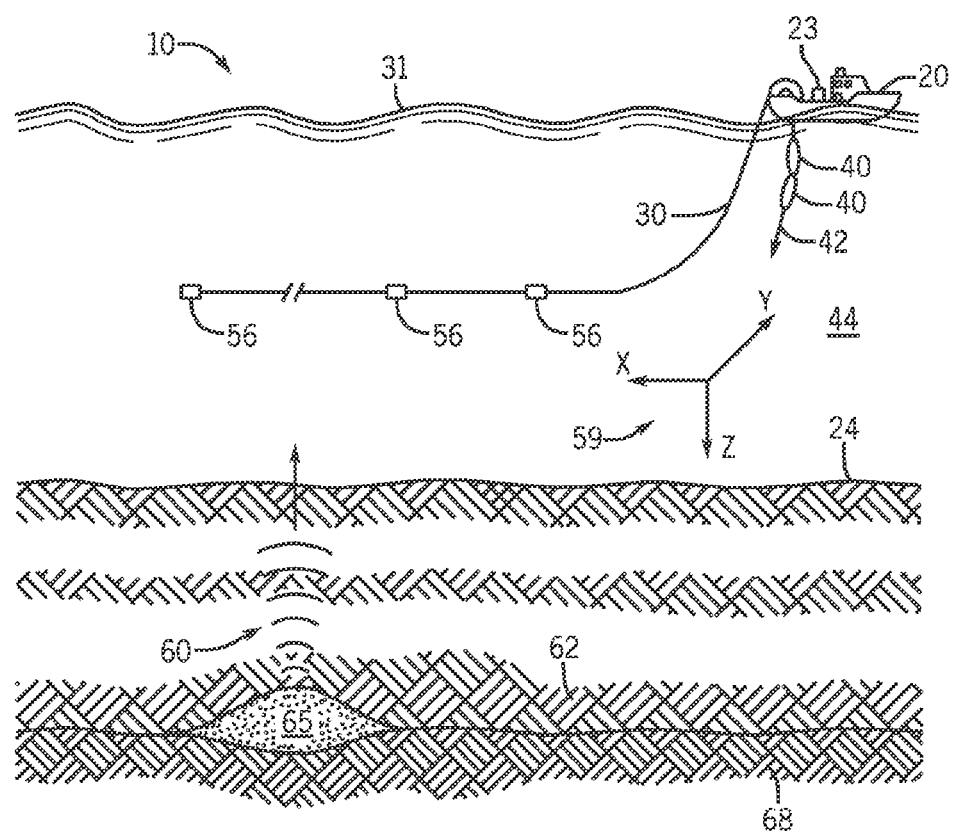
FIG. 1 is a schematic diagram of a marine-based seismic acquisition system according to an example implementation.

FIG. 1 depicts a marine-based seismic data acquisition system 10 in accordance with some implementations. In the system 10, a survey vessel 20 tows one or more seismic streamers 30 (one exemplary streamer 30 being depicted in FIG. 1) behind the vessel 20. It is noted that the streamers 30 may be arranged in a spread in which multiple streamers 30 are towed in approximately the same plane at the same depth. As another non-limiting example, the streamers may be towed at multiple depths, such as in an over/under spread, for example.

The seismic streamers 30 may be several thousand meters long and may contain various support cables (not shown), as well as wiring and/or circuitry (not shown) that may be used to support communication along the streamers 30. In general, each streamer 30 includes a primary cable into which is mounted seismic sensors that record seismic signals. The streamers 30 contain seismic sensor units 56, which may be, depending on the particular implementation, hydrophones (as one non-limiting example) to acquire pressure data or multi-component sensors. In some implementations, as further described herein, the sensor units 56 may contain multi-component sensors. In this regard, different sensors of a given seismic sensor unit 56 may be capable of detecting a pressure wavefield and at least one component of a particle motion that is associated with acoustic signals that are proximate to the sensor. Examples of particle motions include one or more components of a particle displacement, one or more components (inline (x), crossline (y) and vertical (z) components (see axes 59, for example)) of a particle velocity and one or more components of a particle acceleration.

Depending on the particular implementation, the multi-component seismic sensor may include one or more hydrophones, geophones, particle displacement sensors, particle velocity sensors, accelerometers, pressure gradient sensors or combinations thereof.

For example, in accordance with some implementations, a particular multi-component seismic sensor may include a hydrophone for measuring pressure and three orthogonally-aligned accelerometers to measure three corresponding orthogonal components of particle velocity and/or acceleration near the sensor. It is noted that the multi-component seismic sensor may be implemented as a single device (as depicted in FIG. 1) or may be implemented as a plurality of devices, depending on the particular implementation. A particular multi-component seismic sensor may also include pressure gradient sensors, which constitute another type of particle motion sensors. Each pressure gradient sensor measures the change in the pressure wavefield at a particular point with respect to a particular direction. For example, one of the pressure gradient sensors may acquire seismic data indicative of, at a particular point, the partial derivative of the pressure wavefield with respect to the crossline direction, and another one of the pressure gradient sensors may acquire, at a particular point, seismic data indicative of the pressure derivative with respect to the inline direction, and another one of the pressure gradient sensors may acquire, at a particular point, seismic data indicative of the pressure derivative with respect to the vertical direction.

The marine seismic data acquisition system 10 includes seismic sources 40 (two exemplary seismic sources 40 being depicted in FIG. 1), such as air guns and the like. In some implementations, the seismic sources 40 may be coupled to, or towed by, the survey vessel 20. Alternatively, in other implementations, the seismic sources 40 may operate independently of the survey vessel 20, in that the sources 40 may be coupled to other vessels or buoys, as just a few examples.

As the seismic streamers 30 are towed behind the survey vessel 20, acoustic signals 42 (an exemplary acoustic signal 42 being depicted in FIG. 1), often referred to as "shots," are produced by the seismic sources 40 and are directed down through a water column 44 into strata 62 and 68 beneath a water bottom surface 24. The acoustic signals 42 are reflected from the various subterranean geological formations, such as an exemplary formation 65 that is depicted in FIG. 1.

The incident acoustic signals 42 that are created by the sources 40 produce corresponding reflected acoustic signals, or pressure waves 60, which are sensed by the seismic sensor units 56. It is noted that the seismic waves that are received and sensed by the seismic sensor units 56 include "up going" seismic waves that propagate to the sensor units 56 after reflection at the subsurface, as well as "down going" seismic waves that are produced by reflections of the pressure waves 60 from an air-water boundary, or free surface 31.

The seismic sensor units 56 generate signals (digital signals, for example), called "traces," which indicate the acquired measurements of the pressure wavefield and particle motion. The traces are recorded and may be at least partially processed by a signal processing unit 23 that is deployed on the survey vessel 20, in accordance with some implementations. For example, a particular seismic sensor unit 56 may provide a trace, which corresponds to a measure of a pressure wavefield by its hydrophone; and the sensor unit 56 may provide (depending on the particular implementation) one or more traces that correspond to one or more components of particle motion.

The goal of the seismic acquisition is to build up an image of a survey area for purposes of identifying subterranean geological formations, such as the exemplary geological formation 65. Subsequent analysis of the representation may reveal probable locations of hydrocarbon deposits in subterranean geological formations. Depending on the particular implementation, portions of the analysis of the representation may be performed on the seismic survey vessel 20, such as by the signal processing unit 23. In accordance with other implementations, the representation may be processed by a seismic data processing system that may be, for example, located on land or on the vessel 20. Thus, many variations are possible and are within the scope of the appended claims.

Figure 2:
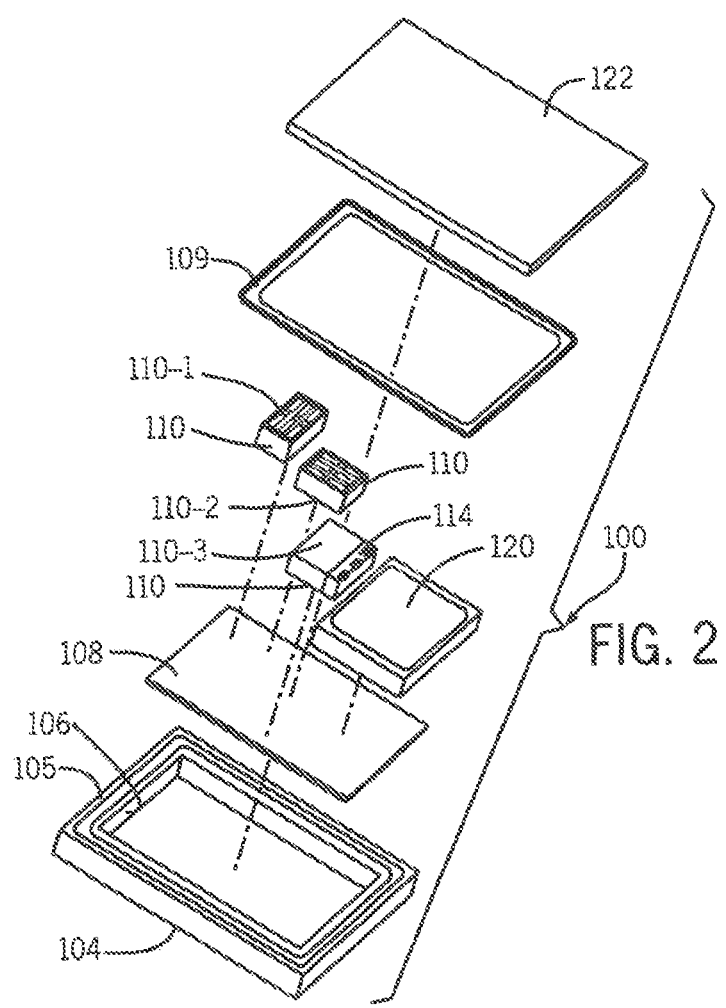
FIG. 2 is an exploded view of a sensor assembly of the streamer of FIG. 1 according to an example implementation.

Referring to FIG. 2, in accordance with example implementations, the sensor unit 56 may include a three component (3C) particle motion sensor assembly, which for this example is a 3C accelerometer assembly 100. The accelerometer assembly 100 acquires inline (x), crossline (y) and vertical (z) (see axes 59 of FIG. 1) particle acceleration measurements. More specifically, the accelerometer assembly 100 includes microelectromechanical system (MEMS) sensors 110 (example MEMS sensor 110-1, 110-2 and 110-3, being depicted in FIG. 2), which sense accelerations along respective inline (x), crossline (y) and vertical (z) axes. In particular, in accordance with some implementations, the MEMS sensors 110 are identical, with the orientations of the MEMS sensors 110 being appropriately varied for purposes of aligning the MEMS sensors 110 with their corresponding axes.

In accordance with some implementations, each MEMS sensor 110 is a fully encapsulated unit, which may be handled, for example, with equipment that is used for purposes of handling and mounting semiconductor packaging (i.e., a "chip") to a substrate. In general, the MEMS sensor 110 includes an armature and a pair of fixed position electrodes, which are rigidly attached to the armature. The MEMS sensor 110 further includes at least one mobile electrode, which is mounted on a moving proof mass that is suspended between the two fixed electrodes by springs that are also connected to the armature. The structure forms a differential capacitor that charges with sensed acceleration. The fixed and mobile electrodes of the MEMS sensor 110 are coupled to the sensor's external conductive terminals or pads, which are exposed externally for purposes of electrically coupling the electrodes of the MEMS sensor 110 to external circuitry (metal layers of a substrate on which the MEMS sensor 110 is mounted, for example). As a non-limiting example, the MEMS sensor 110 may have a design similar to the MEMS sensor that is disclosed in U.S. Patent Publication No. 2010/0116054 A1, herein called the "'054 Application"), entitled, "MEMS-BASED CAPACITIVE SENSOR FOR USE IN A SEISMIC ACQUISITION SYSTEM," which was published on May 13, 2010, and is hereby incorporated by reference in its entirety.

As depicted in FIG. 2, in general, the MEMS sensors 110 are mounted to a substrate 108 of the assembly 100, which may be, as non-limiting examples, a printed circuit board (PCB) or a ceramic substrate, which includes metallic layers. As a non-limiting example, in accordance with some implementations, a given MEMS sensor 110 is electrically coupled and mechanically mounted to the metal layers of the substrate 108 using wire bonding between conductive pads of the MEMS sensor 110 and conductive pads of the substrate 108, although other types of connections may be employed, in accordance with other implementations.

As a more specific example, in accordance with some implementations, the MEMS sensors 110-1 and 110-2 may be associated with the inline and crossline axes, respectively; and for these relative orientations, the MEMS sensor 110-1 is rotated by ninety degrees about the vertical axis of the assembly 100 with respect to the MEMS sensor 110-2. The bottom sides, or faces (not shown in FIG. 3) of the MEMS sensor 110 contains exposed conductive pads, solder balls or the like, which may be mounted (using wire bonding, for example) to exposed conductive pads, of the substrate 108. Because, in accordance with some implementations, the MEMS sensor 110-3 that senses acceleration along the acceleration assembly's vertical axis is positioned so that its conductive pads are not positioned directly on the substrate 108, the accelerometer assembly 100 includes a ninety degree connector 114 that is mounted to these pads for purposes of forming connections between the sensor's pads and corresponding pads of the substrate 108.

As also depicted in FIG. 2, the accelerometer assembly 100 further includes a sensor controller 120 for purposes of converting analog signals from the MEMS sensor 110 into digitized acceleration measurements. In accordance with some implementations, the controller 120 may be a single or multiple die semiconductor package (i.e., an integrated circuit or "chip"), which is mounted on the substrate 108. In this manner, connectors (solder balls, conductive pads, etc.) of the semiconductor package may be mounted to corresponding conductive pads of the substrate 108. Depending on the particular implementations, wire bonding, flip chip-derived bonding, or ball and grid array connectors, etc., may be used to mechanically and electrically couple the controller 120 to the substrate 108. As a non-limiting example, in accordance with some implementations, the controller 120 may be an application specific integrated circuit (ASIC) controller, which has a design that is similar to the controller that is disclosed in the '054 Application, although other controllers may be employed, in accordance with other implementations. In accordance with some implementations, in response to signals that are received from the MEMS sensors 110 at its input pads or terminals, the controller 120 provides external signals at its output pads or terminals, which are indicative of a digital representation of the sensed accelerations along the sensor assembly's inline, crossline and vertical axes.

Among its other features, in accordance with some implementations, the accelerometer assembly 100 includes an open tray 104 (a ceramic or metal tray, as non-limiting examples), which contains recessed region 106 to form an interior space to receive the substrate 108 and its mounted components. In accordance with some implementations, electrical connection terminals (a ball and grid array, for example) is disposed on the internal bottom of the tray 104 for purposes of forming electrical connections with corresponding electrical connection terminals of the substrate 108. Another set of electrical connection terminals may be disposed on the external bottom of the tray 104 for purposes of electrically connecting the accelerometer assembly 100 to communication circuitry (the streamer's backbone, for example) of the streamer 30. Moreover, in accordance with some implementations, the tray 104 includes a groove 105 that is disposed along a rim of the tray 104, which circumscribes the recessed opening 106 for purposes of receiving a seal, such as a gasket 109. As depicted in FIG. 2, the accelerometer assembly 100 may further include a cover to enclose the internal components of the assembly 100, such as the substrate 108, the MEMS sensors 110 and the controller 120 inside an enclosed space. In accordance with some implementations, the cover 112 may be welded or otherwise secured to the tray 104; and the resulting interior cavity of the accelerometer assembly 100 may be filled with an inert and dry gas for purposes of hermetically sealing the internal components of the accelerometer assembly 100 and protecting these components from the environment that is external to the assembly 100.

Other variations are contemplated and are within the scope of the appended claims. For example, in accordance with further implementations, the internal components of the accelerometer assembly 100 may be enclosed by a non-hermetic plastic carrier, which uses silicone or another soft room temperature vulcanizing (RTV) agent to form a seal for environmental protection. In further implementations, a flip-chip version of the MEMS sensors 110 and the controller 120 may be employed or a mixture of flip-chip, wire-bonding and surface mount technology (SMT) may be employed to mount the components of the accelerometer assembly 100 on a common circuit board or multi-chip substrate. Moreover, in accordance with further implementations, additional circuitry, such as telemetry circuitry and power circuitry for the accelerometer assembly 100 may be incorporated on the substrate 108. If the substrate 108 is hermetical, a hermetical chamber for the sensor electronics may be formed by a box of hermetical material on top of the substrate 108. In further implementations, the substrate 108 may be omitted: the metallic layers of the substrate 108 may be incorporated into the tray 104, and the MEMS sensors 110 and the controller 120 may be mounted directly to the tray 104. Thus, many variations are contemplated, which are within the scope of the appended claims.

While a limited number of examples have been disclosed herein, those skilled in the art, having the benefit of this disclosure, will appreciate numerous modifications and variations therefrom. It is intended that the appended claims cover all such modifications and variations.

What is claimed is:

1. A multiple axis sensor assembly, comprising:
   an enclosure;
   encapsulated microelectromechanical system (MEMS) sensors, the encapsulated sensors being disposed inside the enclosure and mounted in different orientations corresponding to different axes of the sensor assembly; and
   a controller disposed in the enclosure and electrically coupled to the MEMS sensors.

2. The assembly of claim 1, wherein the MEMS sensors are identical.

3. The assembly of claim 1, wherein
   a first MEMS sensor of the MEMS sensors comprises a face having electrical connection terminals,
   a second MEMS sensor of the MEMS sensors comprises a face having electrical connection terminals,
   the face of the first MEMS sensor is mounted to the enclosure, and
   a face other than the face of the second MEMS sensor is mounted to the enclosure.

4. The assembly of claim 3, further comprising a right angle connector to electrically couple the second MEMS sensor to the controller.

5. The assembly of claim 1, wherein the enclosure comprises at least one conductive layer, further comprising wire bonding to electrically couple the MEMS sensors to the at least one conductive layer.

6. The assembly of claim 1, wherein the enclosure comprises a tray comprising an opening to receive the MEMS sensors and a lid to close the opening.

7. The assembly of claim 6, wherein the lid is hermetically sealed to the tray, the assembly further comprising a gas charge disposed inside the enclosure.

* * * * *